US008981549B2

United States Patent
Kim et al.

(10) Patent No.: US 8,981,549 B2
(45) Date of Patent: Mar. 17, 2015

(54) MULTI CHIP PACKAGE

(75) Inventors: Hye Jin Kim, Gyunggi-do (KR); Going Sik Kim, Gyunggi-do (KR); Chang Sup Ryu, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 596 days.

(21) Appl. No.: 13/340,436

(22) Filed: Dec. 29, 2011

(65) Prior Publication Data

US 2012/0168960 A1    Jul. 5, 2012

(30) Foreign Application Priority Data

Dec. 31, 2010 (KR) .......... 10-2010-0139897

(51) Int. Cl.
| | | |
|---|---|---|
| H01L 23/48 | (2006.01) | |
| H01L 23/00 | (2006.01) | |
| H01L 23/498 | (2006.01) | |
| H01L 25/065 | (2006.01) | |
| H01L 23/13 | (2006.01) | |
| H01L 23/31 | (2006.01) | |

(52) U.S. Cl.
CPC .......... *H01L 24/48* (2013.01); *H01L 23/49827* (2013.01); *H01L 25/0657* (2013.01); *H01L 23/13* (2013.01); *H01L 24/45* (2013.01); *H01L 2224/16225* (2013.01); *H01L 2224/32014* (2013.01); *H01L 2224/32145* (2013.01); *H01L 2224/32225* (2013.01); *H01L 2224/451* (2013.01); *H01L 2224/4809* (2013.01); *H01L 2224/48091* (2013.01); *H01L 2224/48227* (2013.01); *H01L 2224/48235* (2013.01); *H01L 2224/4824* (2013.01); *H01L 2224/73215* (2013.01); *H01L 2224/73265* (2013.01); *H01L 2224/83101* (2013.01); *H01L 2924/01029* (2013.01); *H01L 2924/01047* (2013.01); *H01L 2924/01082* (2013.01); *H01L 2924/014* (2013.01); *H01L 2924/15311* (2013.01); *H01L 23/3128* (2013.01); *H01L 2224/04042* (2013.01); *H01L 2224/06135* (2013.01); *H01L 2224/06136* (2013.01); *H01L 2225/0651* (2013.01); *H01L 2924/01033* (2013.01); *H01L 2225/06558* (2013.01); *H01L 2924/01028* (2013.01); *H01L 2224/73203* (2013.01)
USPC .................................................. 257/690

(58) Field of Classification Search
CPC .......... H01L 2224/32225; H01L 2224/48227; H01L 2224/4824; H01L 2224/73215; H01L 2224/73265; H01L 2224/32145; H01L 2224/48091; H01L 2224/04042; H01L 2224/48235; H01L 2224/73203; H01L 2225/0651; H01L 2225/06558; H01L 23/49827; H01L 25/0657
See application file for complete search history.

(56) References Cited

U.S. PATENT DOCUMENTS

| | | | | |
|---|---|---|---|---|
| 7,115,972 B2 * | 10/2006 | Dotta et al. | ................... | 257/621 |
| 2004/0149490 A1 * | 8/2004 | Chang et al. | .................. | 174/266 |
| 2009/0140409 A1 * | 6/2009 | Koshiishi et al. | ............. | 257/686 |

FOREIGN PATENT DOCUMENTS

JP    2008109005 A  *  5/2008

* cited by examiner

*Primary Examiner* — Shaun Campbell
*Assistant Examiner* — Raj R Gupta
(74) *Attorney, Agent, or Firm* — Bracewell & Giuliani LLP; Brad Y. Chin

(57) ABSTRACT

The preferred embodiment of the present invention can prevent signal distortions such as stress, or the like, occurring at the time of power delivery due to the difference in the lengths of the metal wires for electrically connecting each of the plurality of semiconductor chips formed on the dual die package substrate.

9 Claims, 2 Drawing Sheets

MULTI CHIP PACKAGE

CROSS REFERENCE TO RELATED APPLICATION

This application claims the benefit of Korean Patent Application No. 10-2010-0139897, filed on Dec. 31, 2010, entitled "Multi Chip Package," which is hereby incorporated by reference in its entirety into this application.

BACKGROUND OF THE INVENTION

1. Technical Field

The present invention relates to a multi chip package.

2. Description of the Related Art

Recently, with the development of a semiconductor industry and the increase in user demand, a demand for small and light electronic devices has increased. One of the technologies applied to satisfy the demands is a multi chip packaging technology. The multi chip packaging technology is a technology of configuring a plurality of semiconductor chips into a single package. Using the multi chip package configured by the multi chip packaging technology is more advantageous in miniaturization, lightness, and a mounting area, as compared with using several packages including a single semiconductor chip.

An example of the multi chip packaging technology may include a method of stacking a plurality of semiconductor chips and a method of arraying a plurality of semiconductor chips in parallel. The former has a structure of stacking the semiconductor chips, such that it can reduce the mounting area and the latter has a structure of arraying the plurality of semiconductor chips on a plane, such that it simplifies a manufacturing process and is advantageous in terms of thickness. Recently, the multi chip package is used for a package requiring miniaturization and lightness. As a result, various ways of stacking the semiconductor chips has been introduced. Among the stacking methods of the multi chip packages, the multi chip package having two semiconductor chips mounted on a lead frame is referred to as a dual die package (DDP) type semiconductor chip package.

FIG. 1 is a cross-sectional view showing a dual die package according to the prior art. As shown in FIG. 1, a center pad type first semiconductor chip 300 is attached to a printed circuit board 100 having a cavity formed at a central portion thereof in a face-down manner by an adhesive 200 and a center pad type second semiconductor type 600 is attached to the bottom surface of the first semiconductor chip 300 in a face-up manner by an adhesive 400. A bonding pad (not shown) of the first semiconductor chip 300 is electrically connected to a circuit pattern (not shown) on the bottom surface of the printed circuit board 100 by a first metal wire 500 penetrating through the cavity of the printed circuit board 100 and a bonding pad (not shown) of the second semiconductor chip 600 is electrically connected to an electrode terminal 120 on the top surface of the printed circuit board 100 by a second metal wire 700.

In addition, the top surface of the printed circuit board 100 including the first semiconductor chip 300, the second semiconductor chip 600, and the second metal wire 700 and the cavity portion of the printed circuit board 100 including the first metal wire 500 and a portion of the entire surface of the first semiconductor chip 300 are sealed with a sealant 900 such as EMC and ball lands 130 mounted on the bottom surface of the printed circuit board 100 are attached with solder balls 140 as a mounting member.

In the case of the dual die package according to the prior art, a structural difference in the lengths of the first metal wire and the second metal wire of each of the first semiconductor chip and the second semiconductor chip occurs. The first semiconductor chip having a relatively short transmission line transmits signals faster than the second semiconductor chip. This causes signal distortions such as stress, etc., occurring at the time of power delivery. Further, there are problems of degradation of electrical characteristics of the dual die package and degradation of operation reliability of the package due to the signal distortions. In addition, even in the case of two or more multi chip packages as well as the dual die package, signal distortions occur due to the difference in the lengths of the metal wires for electrically connecting each semiconductor chip.

SUMMARY OF THE INVENTION

The present invention has been made in an effort to provide a multi chip package capable of preventing signal distortions due to a difference in lengths of metal wires for electrically connecting semiconductor chips disposed in the multi chip package.

According to a first preferred embodiment of the present invention, there is provided a multi chip package, including: a printed circuit board on which a cavity is formed; a first semiconductor chip disposed on one surface of the printed circuit board including the cavity in a face-down manner; and a second semiconductor chip disposed on the first semiconductor chip in a face-up manner, wherein a first metal wire for electrical connection from a first electrode terminal formed on the other surface of the first semiconductor chip is connected to a circuit pattern including a first via on the other surface of the printed circuit board, a second metal wire more extendedly formed than the first metal wire for electrical connection from a second electrode terminal formed on one surface of the second semiconductor chip is connected to a circuit pattern including a second via on one surface of the printed circuit board, and electrical conductivity of a material filled in the second via is larger than that of a material filled in the first via.

The dielectric constant of the filling material of the second via may be higher than that of the filling material of the first via.

The multi chip package may further include an adhesive layer formed between the first semiconductor chip and the second semiconductor chip.

The multi chip package may include a sealant sealing one surface of the printed circuit board including the first metal wire and the second metal wire and the first semiconductor chip and the second semiconductor chip.

The second semiconductor chip may be disposed in a face-down manner.

According to a second preferred embodiment of the present invention, there is provided a multi chip package, including: a printed circuit board on which a cavity is formed; a first semiconductor chip disposed on one surface of the printed circuit board including the cavity in the face-down manner, and a second semiconductor chip disposed on the first semiconductor chip in the face-down manner, and a third semiconductor chip disposed on the second semiconductor chip in the face-down manner, wherein the first metal wire for electrical connection from the first electrode terminal formed on the other surface of the first semiconductor chip is connected to the circuit pattern including the first via on the other surface of the printed circuit board, the second metal wire more extendedly formed than the first metal wire for electrical connection from the second electrode terminal formed on one surface of the second semiconductor chip is connected to the circuit pattern including the second via on one surface of the printed circuit board, a third metal wire more extendedly formed than the second metal wire for electrical connection from the third electrode terminal formed on one surface of the third semiconductor chip is connected to the circuit pattern including the second via on one surface of the printed circuit board, the electrical conductivity of the material filled in the third via is larger than that of the material filled in the second via, and the electrical conductivity of the material filled in the second via is larger than that of the material filled in the first via.

The dielectric constant of the filling material of the second via may be higher than the dielectric constant of the filling material of the first via and the dielectric constant of the filling material of the third via may be higher than the dielectric constant of the filling material of the second via.

The multi chip package may further include an adhesive layer formed between the first semiconductor chip and the second semiconductor chip and between the second semiconductor chip and the third semiconductor chip.

The multi chip package may further include a sealant sealing one surface of the printed circuit board including the first metal wire, the second metal wire and the third metal wire and the first semiconductor chip, the second semiconductor chip, and the third semiconductor chip.

DESCRIPTION OF THE PREFERRED EMBODIMENTS

Figure 1:
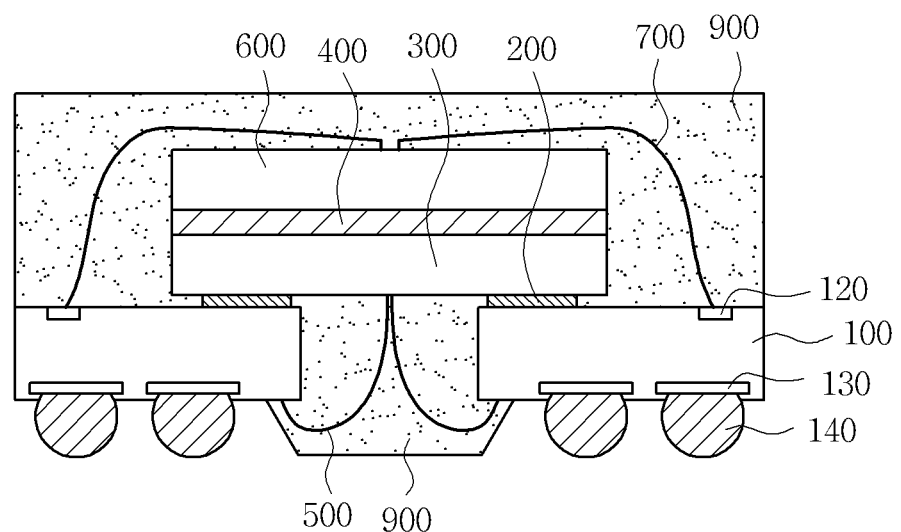
FIG. 1 is a cross-sectional view of a dual die package substrate according to the prior art.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Terms used in the specification, 'one surface', 'the other surface, 'first', 'second', etc. can be used to describe various components, but the components are not to be construed as being limited to the terms. The terms are only used to differentiate one component from other components. Further, in describing the present invention, a detailed description of related known functions or configurations will be omitted so as not to obscure the subject of the present invention. Further, when it is determined that the detailed description of the known art related to the present invention may obscure the gist of the present invention, the detailed description will be omitted.

Hereinafter, preferred embodiments of the present invention will be described in detail with reference to the accompanying drawings.

Figure 2:
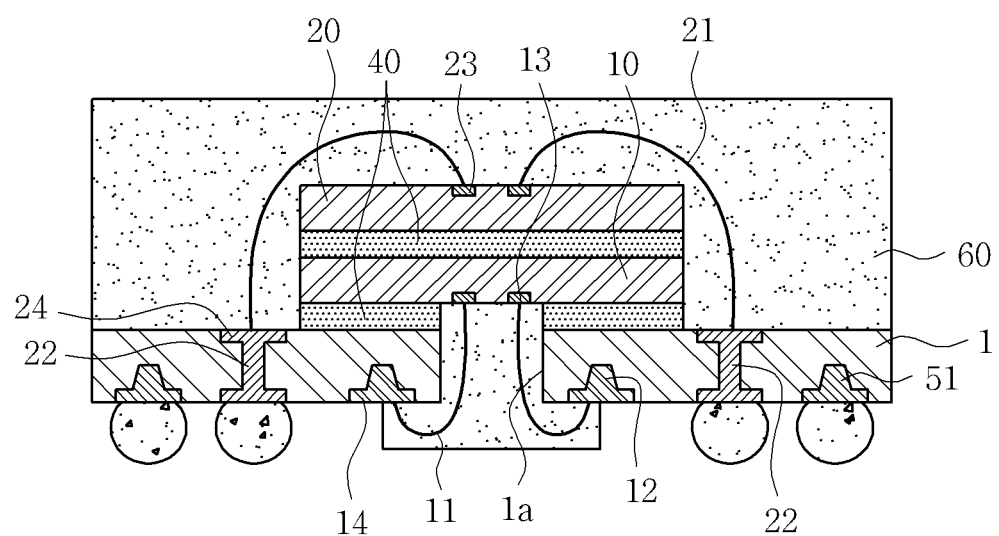
FIG. 2 is a cross-sectional view of a multi chip package according to a first preferred embodiment of the present invention.

FIG. 2 is a cross-sectional view of a multi chip package according to a first preferred embodiment of the present invention. The multi chip package according to the first preferred embodiment of the present invention is configured to include a printed circuit board 1 having a cavity 1a formed thereon, a first semiconductor chip 10 disposed on one surface of the printed circuit board 1 including the cavity 1a in a face-down manner, and a second semiconductor chip 20 disposed on the first semiconductor chip 10 in a face-up manner, wherein a first metal wire 11 for electrical connection from a first electrode terminal 13 formed on the other surface of the first semiconductor chip 10 is connected to a circuit pattern including a first via 12 on the other surface of the printed circuit board 1, a second metal wire 21 more extendedly formed than the first metal wire 11 for electrical connection from a second electrode terminal 23 formed on one surface of the second semiconductor chip 10 is connected to a circuit pattern including a second via 22 on one surface of the printed circuit board 1, and electrical conductivity of a material filled in the second via 22 is higher than that of a material filled in the first via 12.

The first semiconductor chip 10 is mounted on the printed circuit board 1 formed with the cavity 1a in the face-down manner. An adhesive layer 40 may be formed between the first semiconductor chip 10 and the printed circuit board 1 so that the first semiconductor chip 10 is stably mounted on the printed circuit board 1. In this case, the adhesive layer 40 may be composed of an adhesive tape, etc., preferably, a non-conductive material. However, the kind and shape of the adhesive layer 40 is not necessarily limited to ones described herein. The first semiconductor chip 10 is electrically connected to the circuit pattern (not shown) of the printed circuit board 1 through the first metal wire 11. The first metal wire 11 is connected to the first electrode terminal 13 formed on the other surface of the first semiconductor chip 10 for electrically connecting to the circuit pattern of the printed circuit board 1. In particular, as shown in FIG. 2, the first metal wire 11 electrically connects a first land 14 of the printed circuit board 1 to the circuit pattern of the printed circuit board 1 through the first via 12. The first metal wire 11 is electrically connected to the circuit pattern of the printed circuit board 1 by connecting the first metal wire 11 to the first land 14 and the first via 12 through the cavity 1a of the printed circuit board 1 as the first semiconductor chip 10 is mounted in a face-down manner.

The second semiconductor chip is mounted on the first semiconductor chip 10 in a face-up manner. An adhesive chip 40 may be formed so that the second semiconductor chip 20 is seated on the first semiconductor chip 10 and is made of non-conductive material. For example, as the adhesive chip 40, an adhesive tape, or the like, may be used. However, a material and a kind of adhesive layer 40 are not limited to ones described herein. As the second semiconductor chip 20 is mounted in the face-up manner, the second electrode terminal 23 is formed on the top surface of the second semiconductor chip 20. The second metal wire 21 connected from the second electrode terminal 23 is electrically connected to the circuit pattern of the printed circuit board 1 through a second land 24 and a second via 22 of the printed circuit board 1.

In this configuration, the difference in the lengths of the first metal wire 11 for electrically connecting the first semiconductor chip 10 to the circuit pattern of the printed circuit board 1 and the second metal wire 21 for electrically connecting the second semiconductor chip 20 to the circuit pattern of the printed circuit board 1 occurs according to the mounting position of the semiconductor chip. For example, in FIG. 2, the length of the first metal wire 11 may be formed to be shorter than that of the second metal wire 21, such that a signal moving speed through the second metal wire 21 may be relatively slower than a signal moving speed through the first metal wire 11. Therefore, the signal distortions occur according to the difference in the lengths of the first metal wire 11 and the second metal wire 21, the reliability in operation performance of the multi chip package is degraded. As a result, despite the difference in the lengths of the first metal wire 11 and the second metal wire 21, there is a need for a structure capable of preventing signal distortions from occurring by overcoming the difference in each signal moving speed. In the preferred embodiment of the present invention, a material filled in the first via 12 connected to the first metal wire 11 is different from a material filled in the second via 22 connected to the second metal wire 21, thereby preventing signal distortions from occurring. The materials having different electrical conductivity are filled in the first via 12 and the second via 22, respectively, such that the signal moving speeds due to the difference in the lengths of the first metal wire 11 and the second metal wire 21 may coincide to an appropriate range. That is, the effect can be achieved by making the electrical conductivity of the filling material of the first via 12 lower than that of the filling material of the second via 22 in order to make the entire signal moving speed through the first metal wire 11 slow and make the entire signal moving speed through the second metal wire 21 relatively faster. That is, the entire signal moving speed may be balanced by making the signal moving speed at the first via 12 and the second via 22 different. For example, when the filling material of the second via 22 uses a material having high electrical conductivity such as silver, copper, or the like, the filling material of the first via 12 may use relatively lower electrical conductivity such as nickel or solder. The filling material is not limited thereto, but it may be made by a combination of various materials capable of making the electrical conductivity of the first via 12 and the second via 22 different. The same effect can be obtained by making the dielectric constant of the filling material of the first via 12 higher than the dielectric constant of the filling material of the second via 22.

When the first via 12 and the second via 22 are filled with the same material, the difference in the signal moving speed of the first via 12 and the second via 22 may occur by appropriately controlling the diameter of the via. As the sectional area of the via is expanded by Ohm's law, the resistance is lowered, such that current is increased, thereby making the signal moving speed fast. Therefore, the via diameter of the first via 12 is formed to be narrower than that of the second via 22, thereby making it possible to make the signal moving speed at the first via 12 slower than the signal moving speed at the second via 22. As a result, the entire signal moving speed may be balanced.

Figure 3:
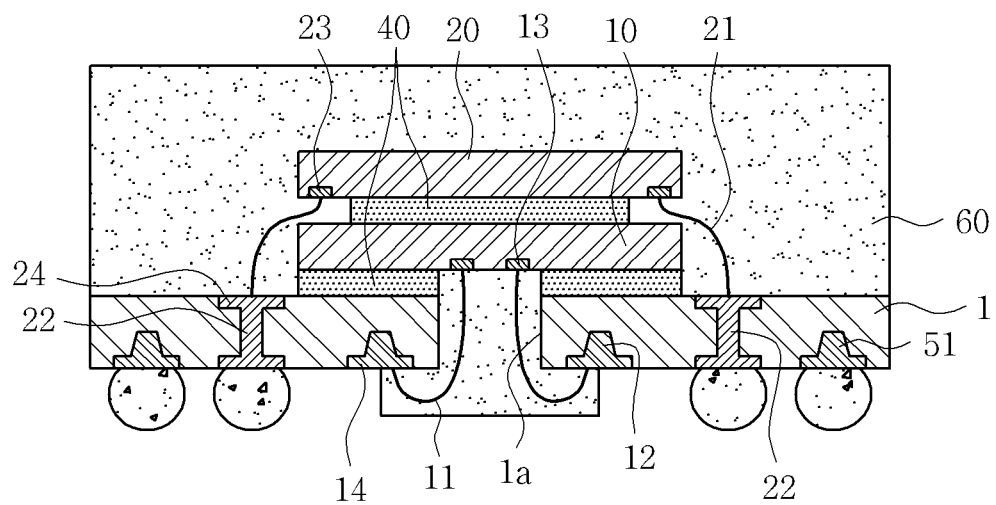
FIG. 3 is a cross-sectional view of a multi chip package according to a second preferred embodiment of the present invention.

FIG. 3 is a cross-sectional view of a multi chip package according to a second preferred embodiment of the present invention. The multi chip package according to the second preferred embodiment of the present invention corresponds to the case when the second semiconductor chip 20 according to the first preferred embodiment is mounted in a face-down manner. As the second semiconductor chip 20 is mounted in a face-down manner, the second electrode terminals 23 formed on the second semiconductor chip 20 are each disposed at both ends of the second semiconductor chip 20 that is an area other than the adhesive layer 40. The structure for preventing signal distortion from occurring due to the difference in the lengths of the first metal wire 11 and the second metal wire 21 and the detailed description thereof overlaps with the first preferred embodiment, and therefore, the description thereof will be omitted.

Figure 4:
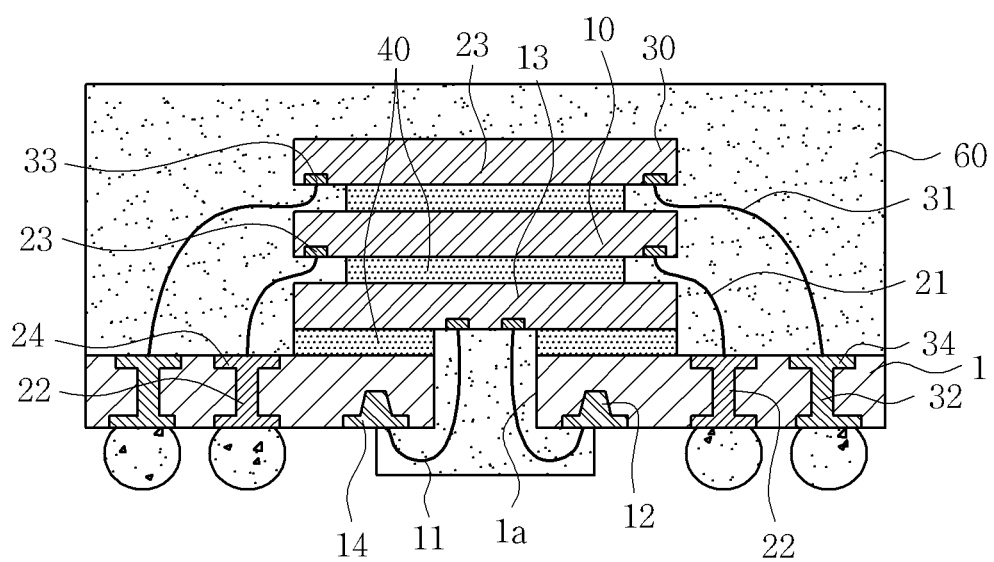
FIG. 4 is a cross-sectional view of a multi chip package according to a third preferred embodiment of the present invention.

FIG. 4 is a cross-sectional view of a multi chip package according to a third preferred embodiment of the present invention. The multi chip package according to the third preferred embodiment of the present invention includes the printed circuit board 1 on which the cavity 1a is formed, the first semiconductor chip 10 disposed on one surface of the printed circuit board 1 including the cavity 1a in the face-down manner, and the second semiconductor chip 20 disposed on the first semiconductor chip 10 in the face-down manner, and the third semiconductor chip 30 disposed on the second semiconductor chip 20 in the face-down manner, wherein the first metal wire 11 for electrical connection from the first electrode terminal 13 formed on the other surface of the first semiconductor chip 10 is connected to the circuit pattern including the first via 12 on the other surface of the printed circuit board 1, the second metal wire 21 more extendedly formed than the first metal wire 11 for electrical connection from the second electrode terminal 23 formed on one surface of the second semiconductor chip 20 is connected to the circuit pattern including the second via 22 on one surface of the printed circuit board 1, a third metal wire 33 more extendedly formed than the second metal wire 21 for electrical connection from the third electrode terminal 33 formed on one surface of the third semiconductor chip 30 is connected to the circuit pattern including the second via 22 on one surface of the printed circuit board 1, the electrical conductivity of the material filled in the third via 32 is larger than that of the material filled in the second via 22, and the electrical conductivity of the material filled in the second via 22 is larger than that of the material filled in the first via 12.

Unlike the first and second preferred embodiment, in the third preferred embodiment, the third semiconductor chip 30 is further mounted. In order to connect the third semiconductor chip 30 to the circuit pattern of the printed circuit board 1, the third metal wire 31 is connected to the third electrode terminal 33 formed on one surface of the third semiconductor chip 30 and is electrically connected to a third land 34 and a third via 32 of the printed circuit board 1. In this configuration, the third metal wire 31 connecting the third semiconductor chip 30 to the circuit pattern of the printed circuit board 1 is formed to be more extended than the first metal wire 11 and the second metal wire 21. Therefore, the electrical conductivity of the filling material of the third via 32 of the printed circuit board 1 is larger than that of the filling material of the second via 22. The difference between the electrical conductivity of the filling material of the third via 32 and the electrical conductivity of the filling material of the second via 22 is a relative difference, such that the filling material may be optionally formed. For example, relatively large electrical conductivity such as silver, copper, or the like, and the relatively low electrical conductivity such as nickel, or the like, and the filling material of the third via 32 and the filling material of the second via 22 with solder may be optionally formed. As a result, the filling material of the first via 12, the filling material of the second via 22, and the filling material of the third via 32 are formed in a high electrical conductivity sequence and the via may be formed in a large diameter sequence as described above.

The repeated contents of the third preferred embodiment of the preferred embodiment of the present invention and the first and second preferred embodiment of the present invention will be omitted.

In the first, second, and third embodiments of the present invention, one surface of the printed circuit board 1 including the semiconductor chips and the metal wires is sealed with a sealant 60 such as EMC.

As set forth above, the preferred embodiment of the present invention can prevent signal distortions such as stress, or the like, occurring at the time of power delivery due to the difference in the lengths of the metal wires for electrically connecting each of the plurality of semiconductor chips formed on the dual die package substrate.

Further, the preferred embodiments of the present invention can prevent the electrical characteristics of the dual die package from being degraded due to signal distortions and can improve the operational reliability of the dual die package.

Although the preferred embodiments of the present invention have been disclosed for illustrative purposes, they are for specifically explaining the present invention and thus a multi chip package according to the present invention is not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A multi chip package, comprising:
   a printed circuit board on which a cavity is formed;
   a first semiconductor chip, a face surface of the first semiconductor chip being disposed on one surface of the printed circuit board including the cavity in a face-down manner; and
   a second semiconductor chip disposed on the first semiconductor chip in a face-up manner;
   wherein a first metal wire for electrical connection from a first electrode terminal formed on the face surface of the first semiconductor chip is connected to a circuit pattern including a first via on the other surface of the printed circuit hoard,
   a second metal wire more extendedly formed than the first metal wire for electrical connection from a second electrode terminal formed on one surface of the second semiconductor chip is connected to a circuit pattern Including a second via on one surface of the printed circuit board, and
   electrical conductivity of a material filled in the second via is larger than that of a material filled in the first via.

2. The multi chip package as set forth in claim 1, wherein the dielectric constant of the filling material of the second via is higher than that of the filling material of the first via.

3. The multi chip package as set forth in claim 1, further comprising an adhesive layer formed between the first semiconductor chip and the second semiconductor chip.

4. The multi chip package as set forth in claim 1, further comprising a sealant sealing one surface of the printed circuit hoard including the first metal wire and the second metal wire and the first semiconductor chip and the second semiconductor chip.

5. A multi chip package, comprising:
   a printed circuit board on which a cavity is formed;
   a first semiconductor chip, a face surface of the first semiconductor chip being disposed on one surface of the printed circuit board including the cavity in a face-down manner; and
   a second semiconductor chip disposed on the first semiconductor chip in a face-down manner,
   wherein a first metal wire for electrical connection from a first electrode terminal formed on the face surface of the first semiconductor chin is connected o a circuit pattern including a first via on the other surface of the printed circuit board,
   a second metal wire more extendedly formed than the first metal wire for electrical connection from a second electrode terminal formed on one surface of the second semiconductor chip is connected to a circuit pattern including a second via on one surface of the printed circuit board, and
   electrical conductivity of a material filled in the second via is larger than that of a material tilled in the first via.

6. A multi chip package, comprising:
   a printed circuit hoard on which a cavity is formed;
   a first semiconductor chip, a face surface of the first semiconductor chip being disposed on one surface of the printed circuit hoard including the cavity in the face-down manner;
   a second semiconductor chip disposed on the first semiconductor chip in the face-down manner; and
   a third semiconductor chip disposed on the second semiconductor chip in the face-down manner,
   wherein the first metal wire for electrical connection from the first electrode terminal formed on the face surface of the first semiconductor chip is connected to the circuit pattern including a first via on the other surface of the printed circuit hoard,
   the second metal wire more extendedly formed than the first metal wire for electrical connection from the second electrode terminal formed on one surface of the second semiconductor chip is connected to the circuit pattern including a second via on one surface of the printed circuit board,
   a third metal wire more extendedly formed than the second metal wire for electrical connection from the third electrode terminal formed on one surface of the third semiconductor chip is connected to the circuit pattern including a third via on one surface of the printed circuit board,
   the electrical conductivity of the material filled in the third via is larger than that of the material filled in the second via, and
   the electrical conductivity of the material filled in the second via is larger than that of the material filled in the first via.

7. The multi chip package as set forth in claim 6, wherein the dielectric constant of the filling material of the second via is higher than the dielectric constant of the filling material of the first via, and
   the dielectric constant of the filling material of the third via is higher than the dielectric constant of the filling material of the second via.

8. The mufti chip package as set forth in claim 6, further comprising adhesive layers formed between the first semiconductor chip and the second semiconductor chip and between the second semiconductor chip and the third semiconductor chip.

9. The multi chip package as set forth in claim 6, further comprising a sealant sealing one surface of the printed circuit board including the first metal wire, the second wire and the third wire and the first semiconductor chip, the second semiconductor chip, and the third semiconductor chip.

\* \* \* \* \*